(12) United States Patent
Lou

(10) Patent No.: US 6,235,625 B1
(45) Date of Patent: May 22, 2001

(54) METHOD OF FABRICATING COPPER DAMASCENE

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/335,553

(22) Filed: Jun. 18, 1999

(30) Foreign Application Priority Data

Apr. 27, 1999 (TW) .................................. 88106719

(51) Int. Cl.$^7$ .............................................. H01L 21/4763
(52) U.S. Cl. ...................... 438/618; 438/619; 438/622; 438/687
(58) Field of Search .................... 438/618, 619, 438/622, 687, 118

(56) References Cited

U.S. PATENT DOCUMENTS 5,693,563 * 12/1997 Teong .
6,004,188 * 12/1999 Roy .

* cited by examiner

*Primary Examiner*—Kevin M. Picardat
*Assistant Examiner*—D. M. Collins
(74) *Attorney, Agent, or Firm*—Jiawei Huang; J. C. Patents

(57) ABSTRACT

A method of fabricating a Cu damascene, the method comprises of forming an amorphous silicon layer in a trench line and a via. The amorphous silicon layer is then displaced with a Cu layer using a Cu displacement process. With the Cu layer serving as a seeding layer, a Cu electroplating or a Cu electroless plating is performed, so that the trench line and the via is selectively filled with the Cu layer.

19 Claims, 5 Drawing Sheets

METHOD OF FABRICATING COPPER DAMASCENE

CROSS-REFERENCE TO RELATED APPLICATION

This application claims the priority benefit of Taiwan application serial no. 88106719, filed Apr. 27, 1999, the full disclosure of which is incorporated herein by reference.

BACKGROUND OF THE INVENTION

1. Field of Invention

The present invention relates to a method of fabricating a multi-level interconnect of a semiconductor feature. More particularly, the invention relates to a method of fabricating a copper (Cu) damascene and a Cu dual damascene.

2. Description of Related Art

It was known that the semiconductor manufacture has entered the deep sub-micron process. In addition to a reduction of the transistor size to increase the device operation speed in such process, the operation speed and reliability of the device can be further increased by manufacturing the device with different materials.

In the backend process of the semiconductor device, the current RC time delay in a metal line has gradually increased as the width of the metal line is reduced. This may easily produce an electron migration (EM) effect in the conventional metal line formed mainly of aluminum (Al), therefore reducing the reliability of the device.

To resolve the above problems encountered by the semiconductor device in the deep sub-micron process, copper (Cu) with a lower resistance and minimum EM effect is adopted and has thus become the uniform choice for all semiconductor device manufacturers.

However, as Cu is not easily etched with common etching gases, a Cu metal line would not be manufactured by a conventional method. A Cu damascene process is therefore proposed.

FIGS. 1A to 1F are schematic diagrams showing the process flow for fabricating a conventional Cu dual damascene.

Referring to FIG. 1A, a silicon oxide ($SiO_x$) layer 102 is formed to cover a substrate 100. A silicon nitride ($SiN_x$) layer 104 is then formed to cover the $SiO_x$ layer 102, while a $SiO_x$ layer 106 is further formed to cover this $SiN_x$ layer 104.

The $SiO_x$ layer 102, the $SiN_x$ layer 104, and the $SiO_x$ layer 106 are made into an inter-metal dielectric layer (IMD layer) in which the method may involve a plasma enhanced chemical vapor deposition (PECVD).

Referring to FIG. 1B, a trench line 108 is formed in the $SiO_x$ layer 106 by photolithography and etching. In the defining process for the trench line 108, the $SiN_x$ layer 104 is used as an etching stop layer to prevent the over etching during the formation of the trench line 108.

Referring to FIG. 1C, the $SiN_x$ layer 104 and the $SiO_x$ layer 102 located at a bottom of the trench line 108 are defined by further photolithography and etching, so that a via 110 is formed at the bottom of the trench line 108.

Referring to FIG. 1D, a barrier layer 112 and a Cu layer 114 are formed in sequence to cover the trench line 108, the via 110, and the $SiO_x$ layer 106. The barrier layer 112 and the Cu layer 114 may be formed by physical vapor deposition (PVD) or CVD.

Referring to FIG. 1E, a Cu electroplating is performed, with the Cu layer 114 serving as a seeding layer, to form a Cu layer 116 that covers the Cu layer 114.

Referring to FIG. 1F, the barrier layer 112 and the Cu layers 114, 116, which layers cover a top surface of the $SiO_x$ layer 106 are removed, so that only a barrier layer 112a and Cu layers 114a, 116a remain in the trench line 108 and the via 110.

The method for removing the barrier layer 112 and the Cu layers 114, 116 that cover the top surface of the $SiO_x$ layer 106 may involve chemical mechanical polishing (CMP).

With the continuing shrinkage of the device size, it is not easy to maintain an excellent conformity of a Cu seeding layer in a structure with a high aspect ratio by PVD.

Furthermore, the Cu seeding layer formed by CVD has a poor quality for its film, while the cost for manufacturing the Cu layer by CVD is very high.

As it is necessary to form the Cu seeding layer by PVD or CVD using additional machines, the cost to perform the conventional fabricating method is higher.

SUMMARY OF THE INVENTION

The present invention provides a method of fabricating a Cu damascene. The Cu seeding layer maintains an excellent conformity and film quality in a structure with a high aspect ratio.

The invention provides a method of fabricating the Cu damascene, the method comprises steps of providing a substrate, forming a dielectric layer to cover the substrate, and forming a trench line and a via in the dielectric layer, wherein the via is below the trench line. The method further comprises steps of forming a barrier layer to conformally cover the trench line, the via, and the dielectric layer, forming an amorphous silicon layer to cover the barrier layer, and forming a photoresist layer to cover the amorphous silicon layer and to fill the trench line and the via. The photoresist layer and the amorphous silicon layer on atop surface of the barrier layer are then removed, followed by the removal of the photoresist layer in the trench line and the via, so that only the amorphous silicon layer and the barrier layer remain in the trench line and the via. A Cu displacement is performed to displace the amorphous silicon layer with a first Cu layer. The trench line and the via are eventually filled with a second Cu layer, while the barrier layer on the dielectric layer is removed.

According to the present invention, an amorphous silicon layer is formed in the trench line and the via, while a Cu displacement is performed to displace the amorphous silicon layer with a Cu layer. With the Cu layer serving as a seeding layer, a Cu electroplating or a Cu electroless plating is performed to selectively fill the trench line and the via with the Cu layer.

In the invention, the amorphous silicon layer with an excellent conformity is used as a displacing material. Therefore, the Cu seeding layer maintains its excellent conformity and film quality in the structure with a high aspect ratio, even though the device size is gradually reduced.

The time to perform a Cu CMP is reduced because the Cu layer selectively fills the trench line and the via, so the throughput of product is improved.

As the fabricating method disclosed by the invention can be achieved with the currently available machines, there is no need to use new machines, such as PVD or CVD Cu machine, thus reducing the cost of the production.

The Cu displacement disclosed by the invention can be performed together with the Cu electroplating or Cu electroless plating in a same machine, and thus beneficial to the process integration.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
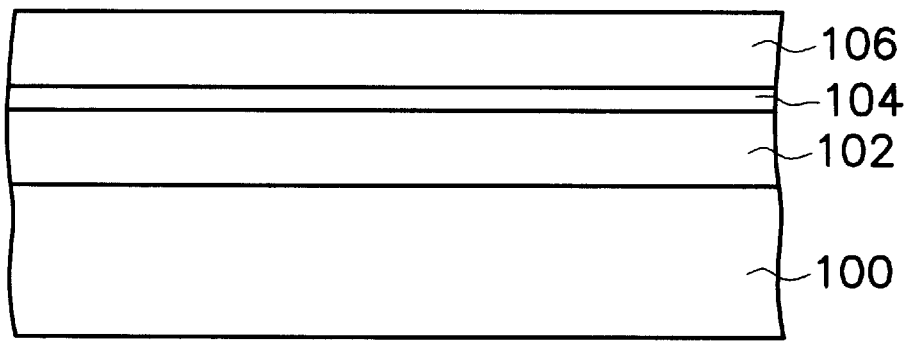
FIGS. 1A to 1F are schematic diagrams showing the process flow for fabricating a conventional Cu dual damascene.
Figure 1B:
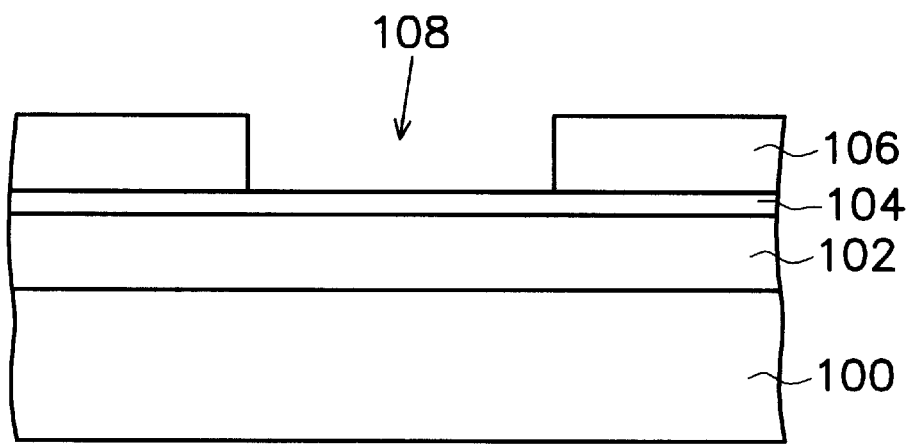
Figure 1C:
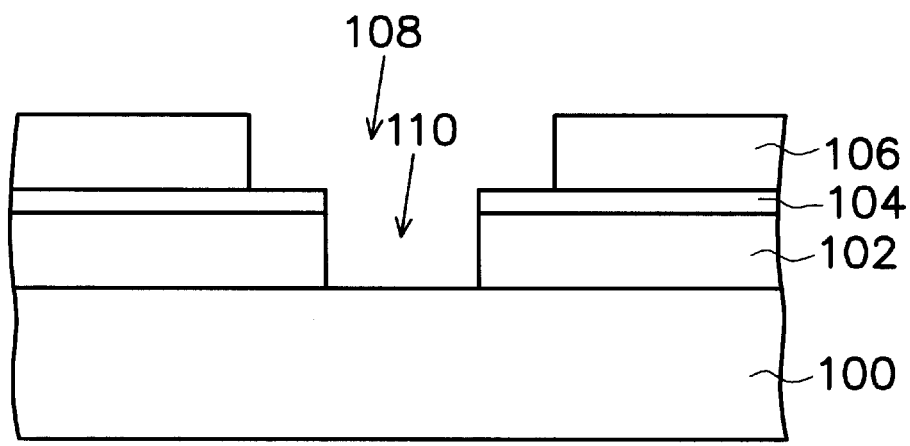
Figure 1D:
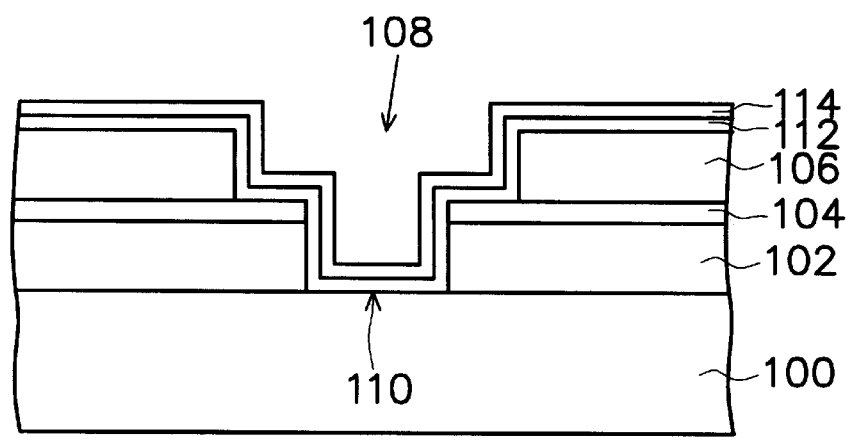
Figure 1E:
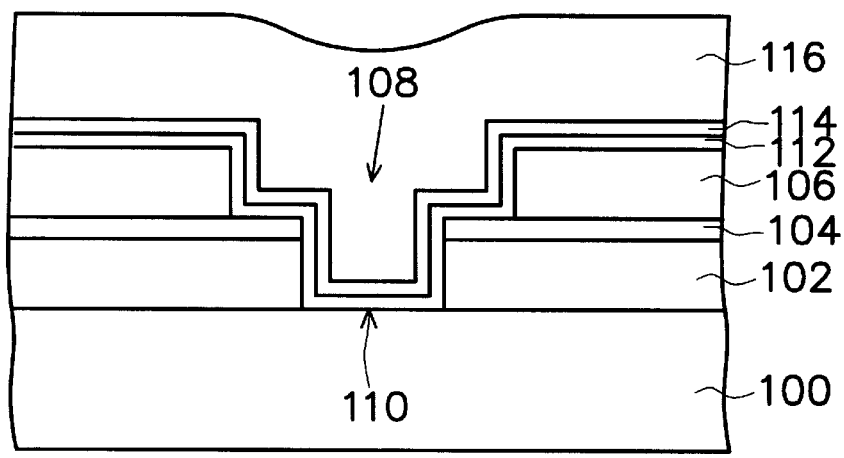
Figure 1F:
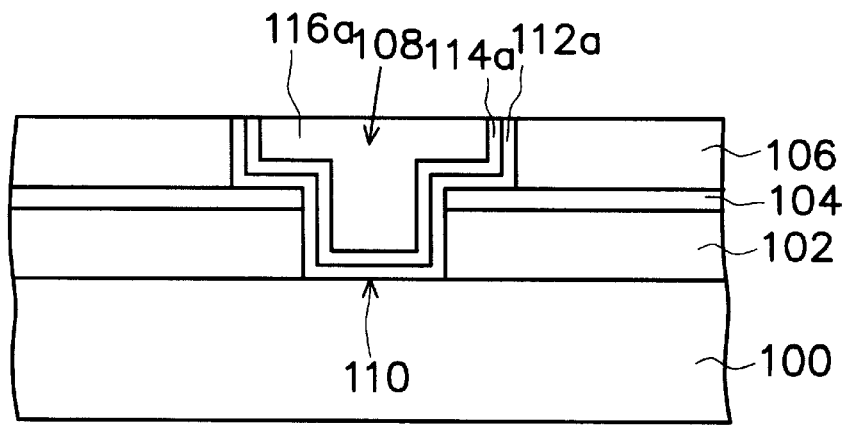

Reference will now be made in detail to the present preferred embodiments of the invention, examples of which are illustrated in the accompanying drawings. Wherever possible, the same reference numbers are used in the drawings and the description to refer to the same or like parts.

FIGS. 2A to 2H are schematic diagrams showing the process flow for fabricating a Cu dual damascene according to the invention.

Figure 2A:
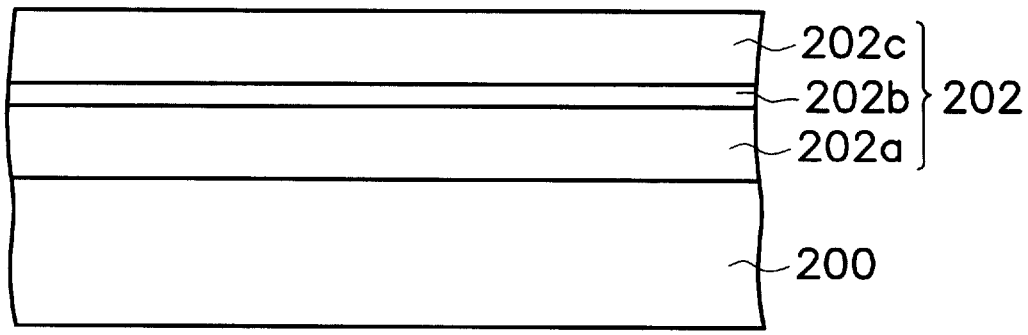
FIGS. 2A to 2H are schematic diagrams showing the process flow for fabricating a Cu dual damascene according to the invention.

Referring to FIG. 2A, a dielectric layer 202 is formed to cover a substrate 200. A silicon oxide ($SiO_x$) layer 202a, a silicon nitride ($SiN_x$) layer 202b, and a further $SiO_x$ layer 202c may be deposited in sequence to form the dielectric layer 202. Also, the dielectric layer 202 may simply be a $SiO_x$ layer or a dielectric layer with a low dielectric constant (k).

The dielectric layer 202 is used as an inter-metal dielectric layer (IMD layer) which is formed by PECVD.

Figure 2B:
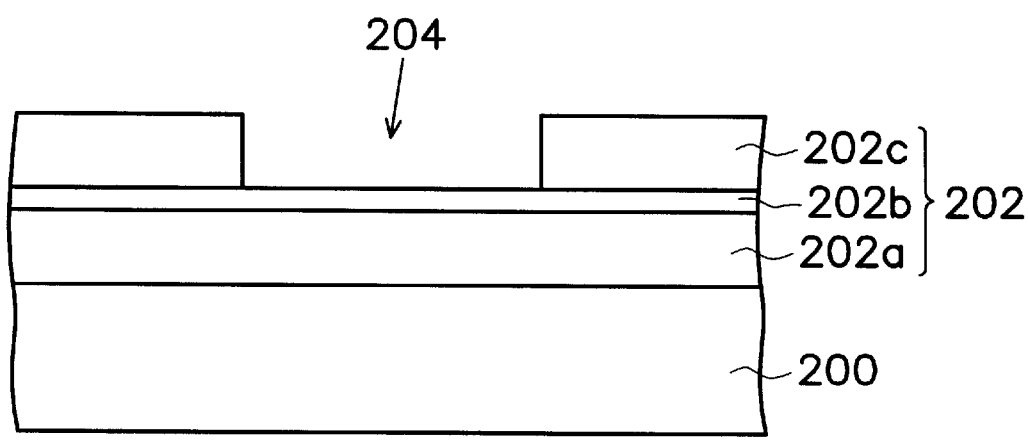

Referring to FIG. 2B, a trench line 204 is formed in the dielectric layer 202 by photolithography and etching. The trench line is formed in this case in the $SiO_x$ layer 202c, while the method may involve using the $SiN_x$ layer 202b as an etching stop layer in the defining step for the trench line 204.

The method for forming the trench line 204 may involve a time mode to control the depth of the trench line 204 if the dielectric layer 202 is simply a $SiO_x$ layer or a dielectric layer with the low k.

Figure 2C:
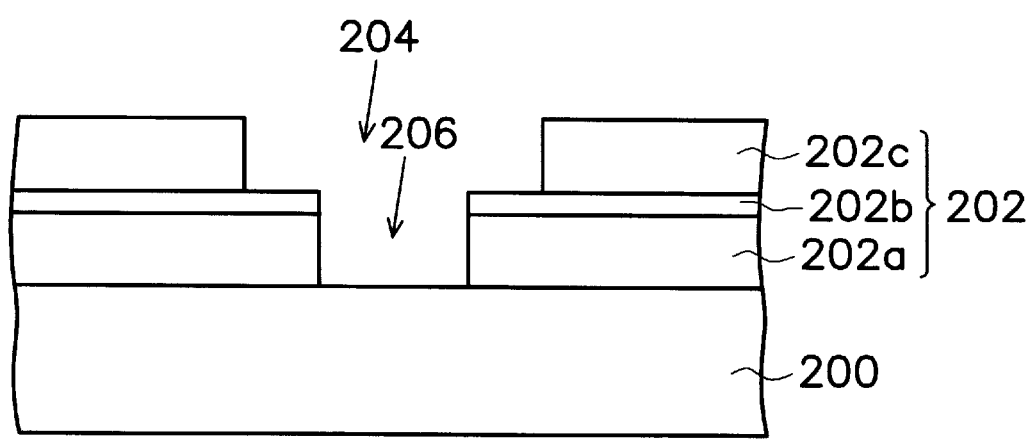

Referring to FIG. 2C, a via 206 is formed by photolithography and etching further from a bottom of the trench line 204. The via 206 may be formed between the $SiN_x$ layer 202b and the $SiO_x$ layer 202a, while the method may involve using the substrate 200 as the etching stop layer in the defining step for the via 206.

Figure 2D:
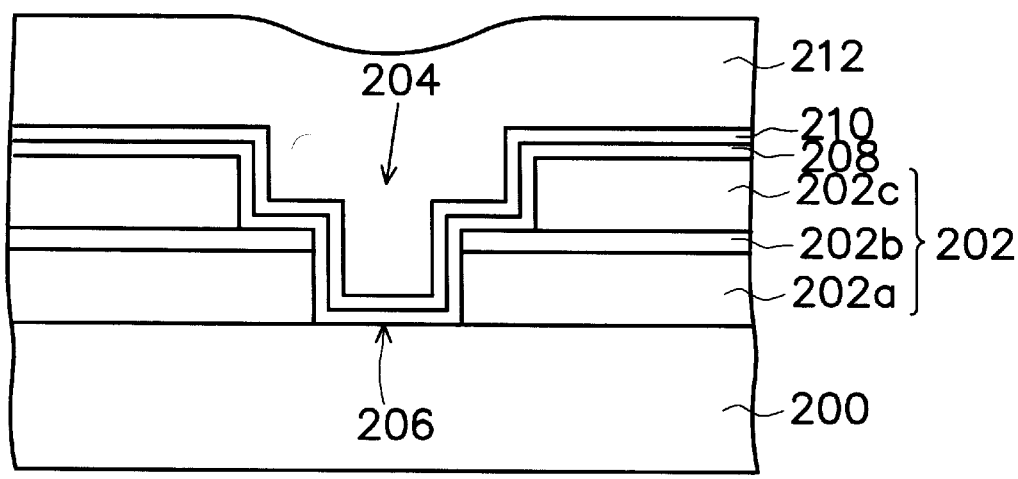

Referring to FIG. 2D, a barrier layer 208 and an amorphous silicon layer 210 are formed in sequence to conformally cover the trench line 204, the via 206, and the dielectric layer 202.

The material for the barrier layer 208 may include titanium nitride (TiN), tungsten nitride (WN), or tantalum nitride (TaN), while the method may involve PVD or CVD.

The method for forming the amorphous silicon layer 210 may include CVD.

A photoresist layer 212 is then formed to cover the amorphous silicon layer 210 and to fill the trench line 204 and the via 206.

Figure 2E:
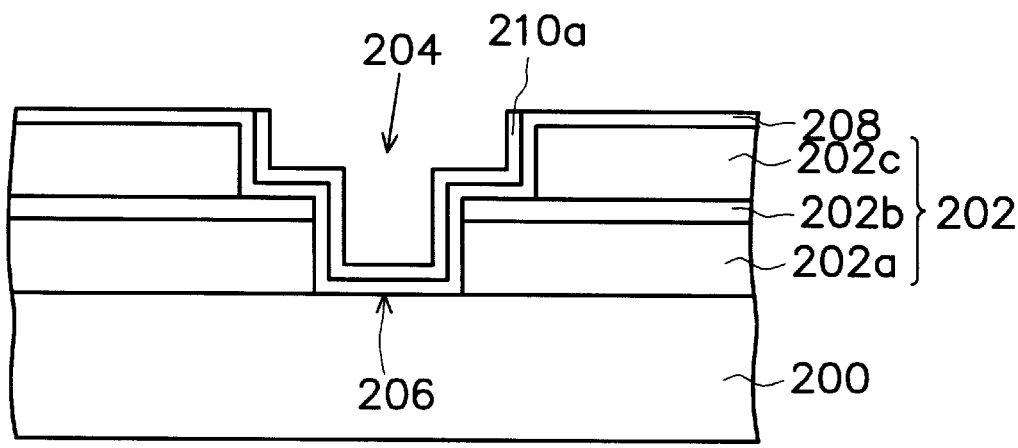

With the barrier layer 208 as the etching stop layer, the photoresist layer 212 and the amorphous silicon layer 210, which layers cover a top surface of the barrier layer 208, are removed as shown in FIG. 2E. Therefore, only the remaining photoresist layer 212 and the amorphous silicon layer 210a remain in the trench line 204 and the via 206.

The removing step in this case may include CMP.

The photoresist layer 212 in the trench line 204 and the via 206 is then removed by the method, such as wet etching. Here, there are only amorphous silicon layer 210a and the barrier layer 208 remaining in the trench line 204 and the via 206.

Figure 2F:
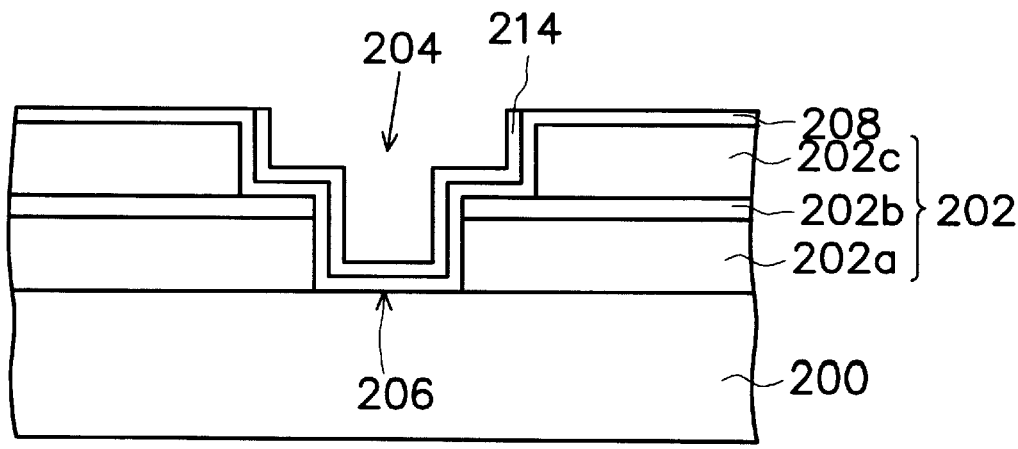

Referring to FIG. 2F, a Cu displacement is performed to displace the amorphous silicon layer 210a with a Cu layer 214. Such Cu displacement may involve using a mixture which consisted of buffer oxide etch (BOE), deionized water, and $CuSO_4$ to displace silicon atoms from the amorphous silicon layer 210a with Cu atoms, whereby forming the Cu layer 214. The thickness of the Cu layer 214 is about 10–500 Å.

The mixture used in the Cu displacement has a volume ratio of about 1:60 for BOE to deionized water, while about 10 ml of $CuSO_4$ with a concentration of 10 g/l is used.

Figure 2G:
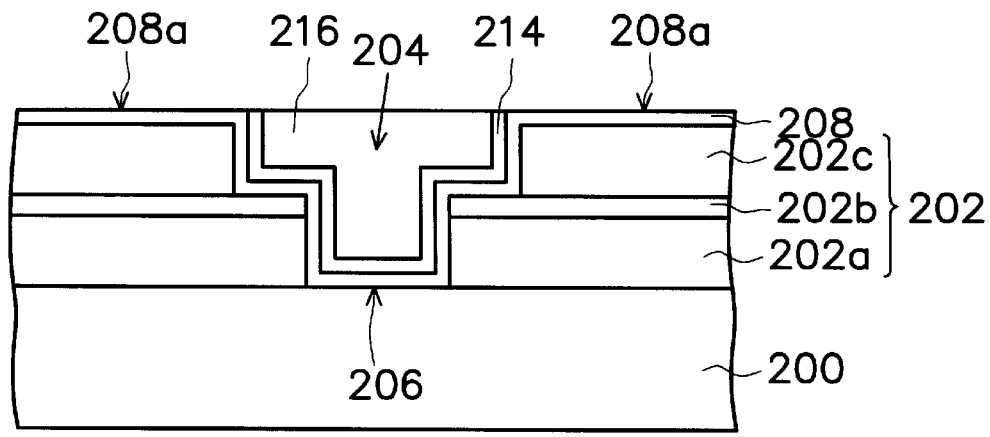

Referring to FIG. 2G, a Cu electroplating or Cu electroless plating is performed with the Cu layer 214 serving as a seeding layer to form another Cu layer 216 that cover over the Cu layer 214.

As the Cu seeding layer 214 only remains in the trench line 204 and the via 206, the Cu layer 216 is only selectively formed in the trench line 204 and the via 206 during the Cu electroplating or Cu electroless plating. Moreover, the Cu layer 216 is not formed on a surface 208a of the barrier layer 208 which is not covered by the Cu layer 214 during the Cu electroplating or Cu electroless plating.

Figure 2H:
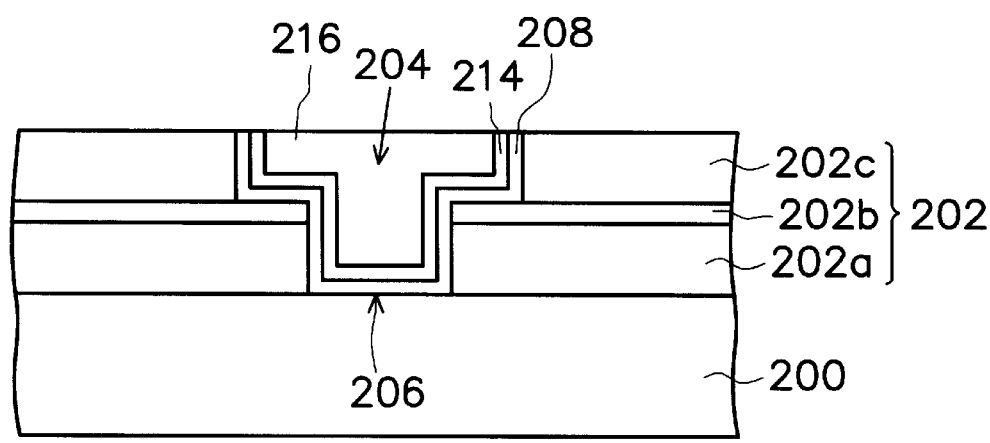

Referring to FIG. 2H, with a top surface of the dielectric layer 202 as the etching stop layer, the barrier layer 208 which covers the top surface of the dielectric layer 202 is removed to expose the top surface of the dielectric layer 202. The method for removing the barrier layer 208 in his case may include CMP. Therefore, this completes the process for fabricating the Cu dual damascene.

Figure 3:
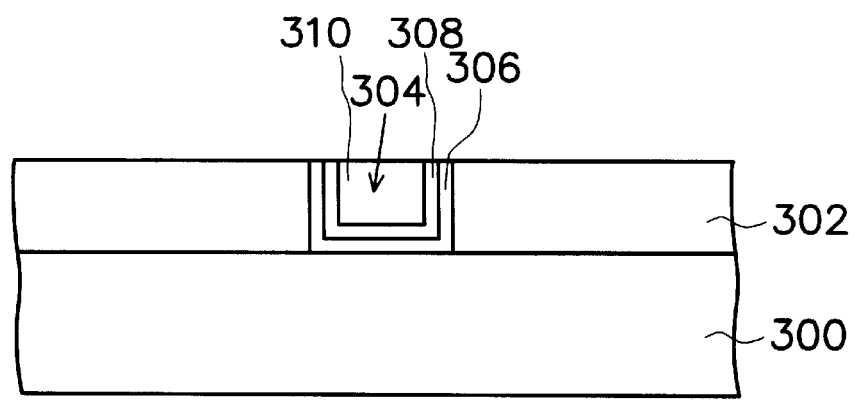
FIG. 3 is a schematic diagram showing the process flow for fabricating a Cu damascene according to the invention.

FIG. 3 is a schematic diagram showing the process flow for fabricating a Cu damascene according to the invention.

Meanwhile, the invention is also applicable to the process for fabricating the Cu damascene with a single via. This is illustrated in FIG. 3, wherein the numerical 300 indicates a substrate, the numerical 302 as an IMD layer, the numerical 304 as a via, the numerical 306 as a barrier layer, the numerical 308 as a Cu layer for a seeding layer, and the numerical 310 as a Cu layer formed by means of the Cu electroplating or Cu electroless plating.

Since the process flow and the material illustrated in FIG. 3 are similar to those in FIGS. 2A to 2H, they are not described in detail here.

According to the present invention, an amorphous silicon layer is formed in a trench line and a via, while a Cu displacement is performed to displace the amorphous silicon layer with a Cu layer. With the Cu layer serving as a seeding layer, a Cu electroplating or a Cu electroless plating is performed to selectively fill the trench line and the via with the Cu layer.

In the invention, the amorphous silicon layer with an excellent conformity is used as a displacing material.

Therefore, the Cu seeding layer maintains its excellent conformity and film quality in the structure with a high aspect ratio, even though the device size is gradually reduced.

The time to perform a Cu CMP is also reduced because the Cu layer selectively fills the trench line and the via, so the throughput of product is again improved.

As the fabricating method disclosed by the invention can be achieved with the currently available machines, there is no need to use new machines, such as PVD or CVD Cu machine, thus reducing the cost of the production.

The Cu displacement disclosed by the invention can be performed together with the Cu electroplating or Cu electroless plating in a same machine, and thus beneficial to the process integration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a copper (Cu) dual damascene, the method comprises steps of:
   providing a substrate;
   forming a dielectric layer to cover the substrate;
   forming a trench line in the dielectric layer;
   forming a via in the dielectric layer, wherein the via is located below the trench line;
   forming a barrier layer to conformally cover the trench line, the via, and the dielectric layer;
   forming an amorphous silicon layer to cover the barrier layer;
   forming a photoresist layer to cover the amorphous silicon layer and to fill the trench line and the via;
   removing the photoresist layer and the amorphous silicon layer covering a top surface of the barrier layer;
   removing the photoresist layer in the trench line and the via, so that only the amorphous silicon layer and the barrier layer remain in the trench line and the via;
   performing a Cu displacement process to displace the amorphous silicon layer with a first Cu layer;
   forming a second Cu layer to fill the trench line and the via; and
   removing the barrier layer which cover a top surface of the dielectric layer.

2. The fabricating method of claim 1, wherein the dielectric layer is composed of a silicon nitride ($SiN_x$) layer and a silicon oxide ($SiO_x$) layer.

3. The fabricating method of claim 1, wherein the barrier layer includes a titanium nitride (TiN) layer.

4. The fabricating method of claim 1, wherein the barrier layer includes a tungsten nitride (WN) layer.

5. The fabricating method of claim 1, wherein the barrier layer includes a tantalum nitride (TaN) layer.

6. The fabricating method of claim 1, wherein the photoresist and the amorphous silicon layer locating on the barrier layer are removed by chemical mechanical polishing (CMP).

7. The fabricating method of claim 1, wherein the solutions involved in the Cu displacement process include a buffer oxide etch (BOE), deionized water, and $CuSO_4$.

8. The fabricating method of claim 7, wherein the mixture ratio of the solution includes a volume ratio of about 1:60 for BOE to deionized water and about 10 ml of $CuSO_4$ with a concentration of 10 g/l is used.

9. The fabricating method of claim 1, wherein the second Cu layer is formed by a Cu electroplating.

10. The fabricating method of claim 1, wherein the second Cu layer is formed by a Cu electroless plating.

11. A method of fabricating a Cu damascene, the method comprises steps of:
    providing a substrate;
    forming a dielectric layer to cover the substrate;
    forming a via in the dielectric layer;
    forming a barrier layer to conformally cover the via and the dielectric layer;
    forming an amorphous silicon layer to cover the barrier layer;
    forming a photoresist to cover the amorphous silicon layer and to fill the via;
    removing the photoresist and the amorphous silicon layer, which layers cover a top surface of the barrier layer;
    removing the photoresist in the via, so that only the amorphous silicon layer and the barrier layer remain in the via;
    performing a Cu displacement process to displace the amorphous silicon layer with a first Cu layer;
    forming a second Cu layer to fill the via; and
    removing the barrier layer which cover a top surface of the dielectric layer.

12. The fabricating method of claim 11, wherein the barrier layer includes a TiN layer.

13. The fabricating method of claim 11, wherein the barrier layer includes a WN layer.

14. The fabricating method of claim 11, wherein the barrier layer includes a TaN layer.

15. The fabricating method of claim 11, wherein the photoresist and the amorphous silicon layer locating on the barrier layer are removed by CMP.

16. The fabricating method of claim 11, wherein the solution involved in the Cu displacement process includes BOE, deionized water, and $CuSO_4$.

17. The fabricating method of claim 11, wherein the mixture ratio of the solution includes a volume ratio of about 1:60 for BOE to deionized water and about 10 ml of $CuSO_4$ with a concentration of 10 g/l is used.

18. The fabricating method of claim 11, wherein the second Cu layer is formed by a Cu electroplating.

19. The fabricating method of claim 11, wherein the second Cu layer is formed by a Cu electroless plating.

* * * * *